(12) United States Patent
Kim

(10) Patent No.: US 10,396,265 B2
(45) Date of Patent: Aug. 27, 2019

(54) COMPOSITE THERMOELECTRIC ELEMENT

(71) Applicant: JOINSET CO., LTD., Ansan-si, Kyeonggi-do (KR)

(72) Inventor: Sun-Ki Kim, Gunpo-si (KR)

(73) Assignee: JOINSET CO., LTD. (KR)

( * ) Notice: Subject to any disclaimer, the term of this patent is extended or adjusted under 35 U.S.C. 154(b) by 197 days.

(21) Appl. No.: 15/718,192

(22) Filed: Sep. 28, 2017

(65) Prior Publication Data
US 2018/0102467 A1  Apr. 12, 2018

(30) Foreign Application Priority Data

Oct. 6, 2016 (KR) .................. 10-2016-0129116
Oct. 19, 2016 (KR) .................. 10-2016-0136038

(51) Int. Cl.
| F25B 21/02 | (2006.01) |
| H01L 35/32 | (2006.01) |
| H01L 35/14 | (2006.01) |
| H01L 35/24 | (2006.01) |

(52) U.S. Cl.
CPC .............. *H01L 35/32* (2013.01); *H01L 35/14* (2013.01); *H01L 35/24* (2013.01)

(58) Field of Classification Search
CPC .......... F25B 21/00; H01L 35/32; H01L 35/14; H01L 35/24; Y10T 428/31504; Y10T 428/31515; B32B 25/00; B32B 25/02; B32B 27/02; B32B 27/00; C08G 2/00; C08L 1/00
See application file for complete search history.

(56) References Cited

FOREIGN PATENT DOCUMENTS

| JP | 2001-358264 A | 12/2001 |
| JP | 2005-210035 A | 8/2005 |
| JP | 2007049053 A | * 2/2007 |
| JP | 2008-80672 A | 4/2008 |
| KR | 10-0755014 B1 | 9/2007 |
| KR | 0-1228603 B1 | 1/2013 |

* cited by examiner

*Primary Examiner* — Edward F Landrum
*Assistant Examiner* — Kamran Tavakoldavani
(74) *Attorney, Agent, or Firm* — Park & Associates IP Law, P.C.

(57) ABSTRACT

A composite thermoelectric element including thermoelectric sheets each including a facing surface and an exposed surface, which are opposite to each other, and a graphite sheet embedded in the thermoelectric sheets from the facing surfaces thereof. Here, edges of the graphite sheet are separated inward from edges of the thermoelectric sheets such that a contact portion is formed at the facing surfaces of the thermoelectric sheets. Also, the contact portion of the thermoelectric sheets is stuck to one of the objects due to the self stickiness, and the graphite sheet comes in contact with the other of the objects.

17 Claims, 8 Drawing Sheets

COMPOSITE THERMOELECTRIC ELEMENT

REFERENCE TO RELATED APPLICATIONS

This application claims the priority benefit of Korean Patent Application No. 10-2016-0129116 filed on Oct. 6, 2016 and 10-2016-0136038 filed on Oct. 19, 2016, the entire contents of which are incorporated herein by reference.

FIELD OF THE INVENTION

The present invention relates to a composite thermoelectric element, and more particularly, to a composite thermoelectric element to which graphite is applied as a heat transfer medium.

BACKGROUND OF THE INVENTION

As getting smaller and integrated, electronic devices and data communication devices are affected more by heat, static electricity, or electromagnetic waves. For example, since, as electronic components, as a microprocessor has a higher processing speed and a memory semiconductor has a larger capacity and increased integration degree, ambient heat, static electricity, and electromagnetic waves have a large impact on the microprocessor and memory semiconductor.

Accordingly, it is necessary to quickly discharge heat generated by an electronic component mounted therewith, such as an integrated circuit (IC) and a light emitting diode (LED) or a heat source such as an electronic component module.

For this, there is generally used a method of discharging heat through a thermoelectric element by interposing the thermoelectric element between a case which accommodates electronic components that generate heat and a heat source to use the case as a cooling unit.

For example, a thermoelectric sheet is used to quickly transfer heat generated by an IC or a display provided at a smart phone to another place to cool the IC or display. As thermoelectric sheet, a graphite sheet which has a small thickness and flexibility, a heat-conductive silicone rubber sheet, a heat pipe, or the like may be used.

A heat-conductive silicone rubber sheet has elasticity and flexibility but has a disadvantage of lower heat conductivity than that of a graphite sheet or heat pipe. Particularly, heat conductivity in a surface direction is lower than that in a thickness direction.

Since a graphite sheet is formed by stacking and pressurizing flake powder, heat conductivity is high about 1,000 W in a surface direction but is lower in a thickness direction than that in the surface direction.

As a heat emitting sheet to which a graphite sheet is applied, Korean Patent Registration No. 755014 discloses a technology in which a thermoelectric adhesive manufactured by mixing poly dimethylsiloxane, silicone resin, and thermalconductive fillers is applied to one side of a graphite heat emitting sheet and a poly(methyl methacrylate)-trialkoxysilane copolymer coating solution is applied to the other side thereof to be easily stuck to a display product, to have heat conductivity, and to prevent graphite powder from scattering.

However, according to the above-described configuration, a heat emitting sheet is supplied in a roll shape and cut by a consistent length to be used. Here, since a graphite sheet is exposed at a section and has a flake structure in which leaves are piled up in a thickness direction, graphite powder scatters at the section and the heat emitting sheet is easily separated from the graphite sheet.

Also, when a coating solution is applied to one side of the graphite sheet and the heat emitting sheet is interposed between objects, since one object is in contact with a thermal conductive adhesive and the other object is in contact with the coating solution, there is a problem in which heat conductivity is decreased.

Also, there are problems such as an unreliable contact between objects which face each other and inadequate absorption of shocks applied to the objects.

SUMMARY OF THE INVENTION

Therefore, it is an aspect of the present invention to provide a composite thermoelectric element capable of preventing graphite powder from being scattered outward from at least a cross section.

It is another aspect of the present invention to provide a composite thermoelectric element capable of reliably conducting heat by mechanically protecting a graphite sheet well.

It is another aspect of the present invention to provide a composite thermoelectric element having high heat conductivity through reliable contact with facing objects.

It is another aspect of the present invention to provide a composite thermoelectric element capable of absorbing an external shock applied to objects.

It is another aspect of the present invention to provide a composite thermoelectric element having an excellent electromagnetic wave shielding effect at a high frequency.

In accordance with one aspect of the present invention, a composite thermoelectric element which is interposed between facing objects disposed to face each other and transfers heat between the objects includes a thermoelectric sheet a facing surface and an exposed surface, which are opposite to each other, and having self stickiness at least at the facing surface, and a graphite sheet which is embedded in the thermoelectric sheet from the facing surface of the thermoelectric sheet and has a top surface exposed outward. Here, edges of the graphite sheet are separated inward from edges of the thermoelectric sheets such that a contact portion is formed at the facing surfaces of the thermoelectric sheets between the edges. Also, the contact portion of the thermoelectric sheet is stuck to any one of the objects due to the self stickiness, the graphite sheet comes into contact with the one of the objects, and the exposed surface of the thermoelectric sheet comes into contact with the other of the objects.

A sticky sheet may be stuck to the graphite sheet and may have heat conductivity which is lower than those of the thermoelectric sheets.

Stickiness of the sticky sheet may be greater than stickiness of the thermoelectric sheets, and a thickness of the sticky sheet may be smaller than thicknesses of the thermoelectric sheets.

The thermoelectric sheets may be formed by mixing a polymer resin or rubber having elasticity or flexibility and stretch with insulating ceramic powder, metal powder, or a mixture of these types of powder.

The exposed surface of at least one of the thermoelectric sheets may include self stickiness and may be stuck to any one of the objects due to the self stickiness of the exposed surface of at least one of the thermoelectric sheets.

A thickness of the composite thermoelectric element may be about 1 mm or less, and thicknesses of the thermoelectric sheets may be greater than a thickness of the graphite sheet.

An area of the graphite sheet may be larger than an area of a heating element in contact with the graphite sheet.

A plurality of such graphite sheets may be formed to be separated from one another, or central parts thereof may be partially removed.

In accordance with other aspect of the present invention, a composite thermoelectric element which is interposed between facing objects disposed to face each other and transfers heat between the objects includes a graphite sheet, and a pair of thermoelectric sheets which comprise facing surfaces and exposed surfaces, in which the facing surfaces cover a top surface and a bottom surface of the graphite sheet and are adhered thereto to seal the graphite sheet. Here, edges of the graphite sheet are separated inward from edges of the thermoelectric sheets, and a contact portion is formed on the facing surfaces of the thermoelectric sheets between the edges thereof. Also, the thermoelectric sheets are stuck to each other at the contact portion due to self stickiness of any one of the facing surfaces of the thermoelectric sheets.

A part of any one of the thermoelectric sheets, which corresponds to a part of the graphite sheet, may be removed, and the part of the graphite sheet of the removed part comes into direct contact with any one of the objects.

A part of the other of the thermoelectric sheets, which corresponds to the part of the graphite sheet, may be removed.

The graphite sheet may be embedded in any one of the thermoelectric sheets from the facing surface of the corresponding thermoelectric sheet.

A sticky sheet may be stuck to the graphite sheet.

The self stickiness may be given by a process of curing a liquid rubber or resin.

The exposed surface of at least one of the thermoelectric sheets may comprise self stickiness and be stuck to the object due to the self stickiness of the exposed surface of at least one of the thermoelectric sheets.

The exposed surfaces of the thermoelectric sheets may have self stickiness different from each other.

At least one of the thermoelectric sheets may be in a gel state.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF THE INVENTION

The technical terms used herein are merely for describing particular embodiments and are not intended to limit the present invention. Also, the technical terms used herein, unless defined otherwise, should be interpreted as having meanings generally understood by one of ordinary skill in the art and not be interpreted as having excessively comprehensive meanings or excessively reduced meanings. Also, when the technical terms used herein are wrong technical terms which can not clearly describe the concept of the present invention, they should be understood while being replaced by technical terms capable of being properly understood by those skilled in the art. Also, general terms used herein should be interpreted according to the previously defined or according to back-and-forth context and not be understood as having excessively reduced meanings.

Hereinafter, embodiments of the present invention will be described in detail with reference to the attached drawings.

Figure 1A:
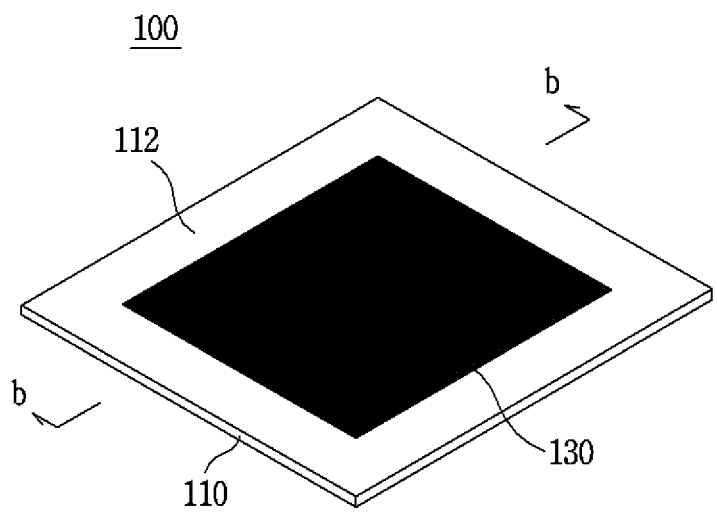
FIG. 1A is a perspective view of a composite thermoelectric element according to one embodiment of the present invention.
Figure 1B:
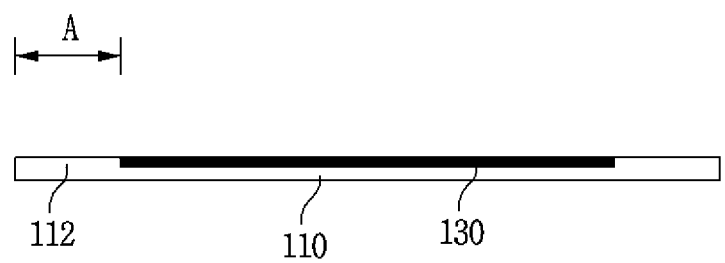
FIG. 1B is a cross-sectional view illustrating the composite thermoelectric element taken along line b-b in FIG. 1A.

FIG. 1A is a perspective view of a composite thermoelectric element according to one embodiment of the present invention, and FIG. 1B is a cross-sectional view illustrating the composite thermoelectric element taken along line b-b in FIG. 1A.

A composite thermoelectric element 100 includes a thermoelectric sheet 110 having self stickiness and a graphite sheet 130 embedded from a top surface of the thermoelectric sheet 110.

The graphite sheet 130 may be an artificial graphite sheet having high heat conductivity.

The thermoelectric sheet 110 may be formed by mixing a polymer resin such as an acrylic resin and the like or rubber such as silicone rubber and the like, which has elasticity and flexibility, with insulating ceramic powder such as alumina, boron, and the like, a conductive metal powder such as carbon, CNT, copper, or the like, or a mixture of the insulating ceramic powder and the conductive metal powder, but is not limited thereto.

Preferably, the thermoelectric sheet 110 may be electrically insulated.

Since heat conductivity is high but self stickiness is low when a large amount of heat-conductive powder is inserted, it is necessary to adjust a material and an amount of heat-conductive powder.

To provide a high heat transfer effect in a thickness direction, heat conductivity of the thermoelectric sheet 110 in a thickness direction may be 0.4 W or more.

The self stickiness of the thermoelectric sheet 110 may be provided by a process of curing a liquid material among materials which form the thermoelectric sheet 110.

Although not limited, the composite thermoelectric element 100 may have a thickness of about 1 mm or less, thermoelectric sheets 110 may have a thickness of about 0.01 mm to 0.4 mm, and the graphite sheet 130 may have a thickness of about 0.01 mm to 0.2 mm.

In FIG. 1B, a top surface of the thermoelectric sheet 110 and a top surface of the graphite sheet 130 are at the same horizontal level but are not limited thereto.

An edge of the thermoelectric sheet 110 is extended from an edge of the graphite sheet 130 such that a part of the thermoelectric sheet 110 therebetween forms a contact portion 112.

As well known, due to a flake structure in which leaves are piled up in a thickness direction, a graphite sheet is easily delaminated as a layer shape in the thickness direction but graphite powder is not scattered from a surface or a rear surface of the graphite sheet.

Accordingly, in this embodiment, although the surface of the graphite sheet 130 is exposed outward, a possibility of graphite powder being scattered from the surface is low. Since the graphite sheet 130 is embedded in the thermoelectric sheet 110, graphite powder is not scattered from a side of the graphite sheet 130, which is cut during a cutting process.

Also, as described below, since the graphite sheet 130 is in contact with an object and the contact portion 112 of the thermoelectric sheet 110 is stuck to the same object, the graphite sheet 130 is actually isolated such that it is possible to prevent graphite powder from being discharged outward even when the graphite powder is generated from the surface of the graphite sheet 130.

In this embodiment, although the thermoelectric sheet 110 includes the contact portion 112 corresponding to each edge, it is possible to reduce occurrence of graphite powder even when the contact portion 112 is formed corresponding to at least the cutting surface of the thermoelectric sheet 110.

Also, heat transfer in the surface direction is easily performed by the graphite sheet 130 and heat transfer in the thickness direction is easily performed by a well contact with the object, which is opposite thereto, due to the thermoelectric sheet 110.

Also, due to a simple structure, a light weight, and a low price thereof, the composite thermoelectric element may be applied to a wide area, a very narrow part, or the like for a variety of uses.

Figure 2A:
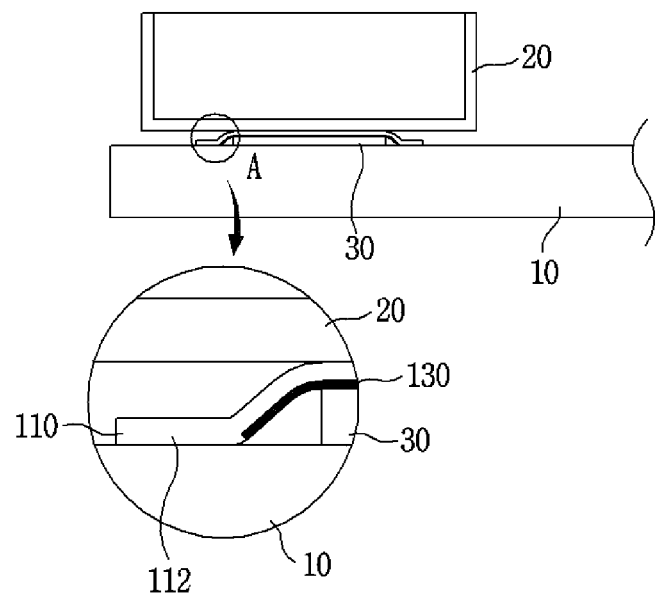
FIGS. 2A and 2B illustrate one example of applying the composite thermoelectric element of FIG. 1A.
Figure 2B:
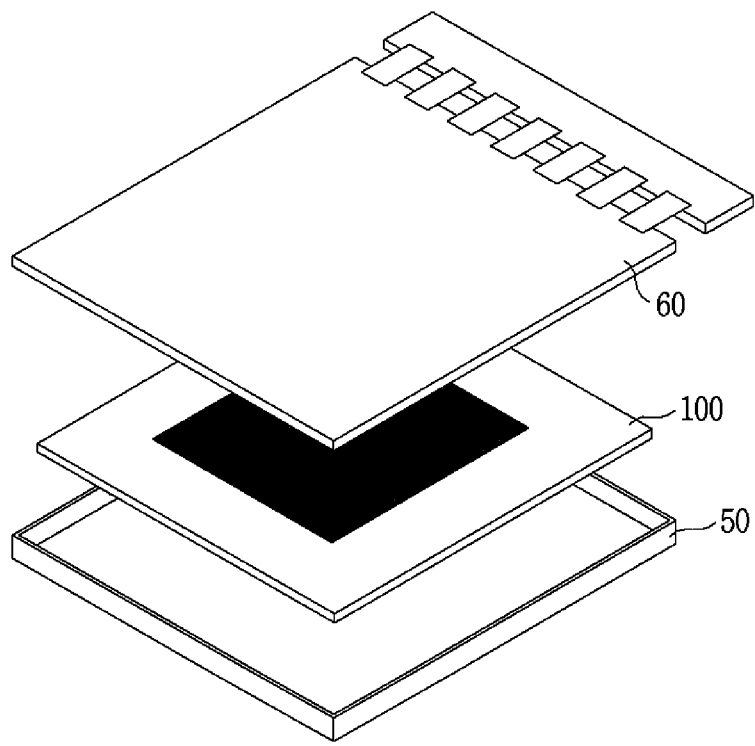

FIGS. 2A and 2B illustrate one example of applying a thermoelectric element.

Referring to FIG. 2A, the composite thermoelectric element 100 is used for covering a heating element 30 while being turned inside out. Here, the graphite sheet 130 comes into direct contact with the heating element 30 mounted on a circuit board 10 to cover the heating element 30.

The contact portion 112 of one surface of the thermoelectric sheet 110 is self-stuck to the circuit board 10 by self stickiness thereof, and the other surface of the thermoelectric sheet 110 comes into contact with a heat dissipation unit 20. Here, the thermoelectric sheet 110 is electrically insulated.

Since a size of the graphite sheet 130 is larger than a size of the heating element 30, heat transfer in the surface direction is quickly performed by the graphite sheet 130. Also, even when graphite powder is generated from the surface of the graphite sheet 130 as described above, since the graphite sheet 130 is isolated by the thermoelectric sheet 110, the graphite powder is not discharged outward.

Since the thermoelectric sheet 110 has a low degree of hardness and relatively high self stickiness, it is easily maintain such adhesion once the thermoelectric sheet 110 is stuck to the circuit board 10 through the self stickiness.

Also, heat generated from the heating element 30 is transferred to the heat dissipation unit 20 or another place through the graphite sheet 130 and thermoelectric sheet 110 having a high heat transfer rate in the thickness direction and simultaneously heat of the circuit board 10 is transferred to the heat dissipation unit 20 through the graphite sheet 130 and the thermoelectric sheet 110.

Referring to FIG. 2B, the composite thermoelectric element 100 may be interposed between a backlight module 60 of a smart phone and a back cover 50 formed of a metal material. Here, the composite thermoelectric element 100 may absorb an external shock applied to the back cover 50 and may quickly transfer heat generated from the backlight module 60 to the back cover 50.

Figure 3A:
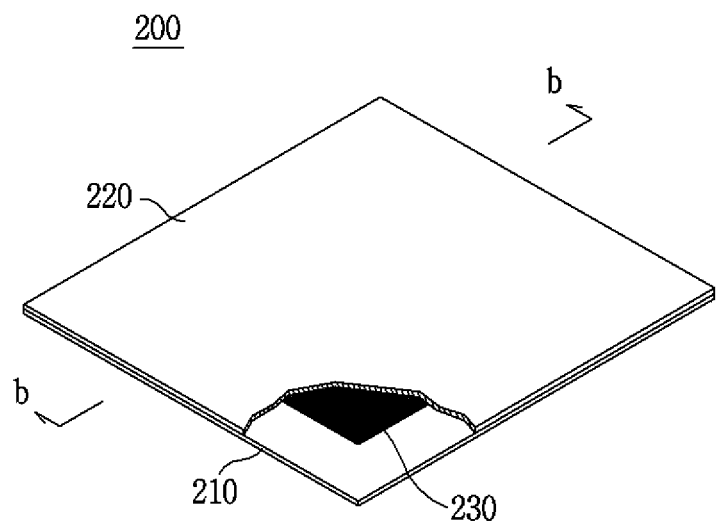
FIGS. 3A and 3B illustrate a composite thermoelectric element according to another embodiment of the present invention.
Figure 3B:
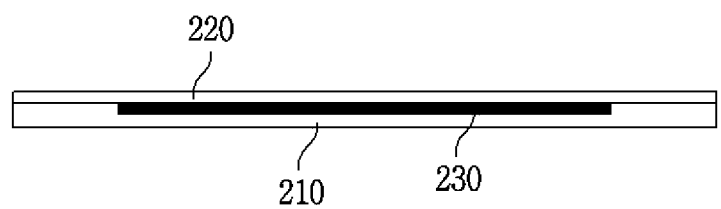

FIGS. 3A and 3B illustrate a composite thermoelectric element according to another embodiment of the present invention.

A composite thermoelectric element 200 includes a graphite sheet 230 and thermoelectric sheets 210 and 220 which cover both sides of the graphite sheet 230. Since sizes of a size of the thermoelectric sheets 210 and 220 is greater than a size of the graphite sheet 230, edges of the graphite sheet 230 are not exposed outward.

According to the above structure, heat transfer in a surface direction is easily performed by the graphite sheet 230 and heat transfer in a thickness direction is easily performed by a well contact with facing objects due to the thermoelectric sheets 210 and 220.

In this embodiment, the graphite sheet 230 is embedded in the thermoelectric sheet 210 such that a thickness of the composite thermoelectric element 200 is reduced.

The thermoelectric sheets 210 and 220 may include the same or similar materials to provide high adhesion through self stickiness but are not limited thereto.

A thickness of the thermoelectric sheet 220 attached to a heating element is smaller than a thickness of the thermoelectric sheet 210 not attached to a heating element.

According to this embodiment, since the thermoelectric sheets 210 and 220 are not stuck by interposing an additional adhesive, there are provided advantages such as a reduced overall thickness and high heat conductivity.

Also, since the thermoelectric sheets 210 and 220 are stuck to each other through self stickiness thereof without using an additional adhesive, heat conductivity may be improved and manufacturing costs may be reduced in comparison to a structure using a general polyethylene terephthalate (PET) film and an additional adhesive.

Also, since the thermoelectric sheets 210 and 220 have restoration forces and high elasticity or flexibility and stretch, even when the composite thermoelectric element 200 is bent by an external force, deformation of the graphite sheet 230 is minimized due to restoration and stretch. Accordingly, it is possible to maintain reliable contact with an object and prevent heat conductivity from being decreased.

Also, due to a simple structure, a light weight, and a low price thereof, the composite thermoelectric elements may be applied to a wide area, a very narrow part, or the like for a variety of uses.

Figure 4A:
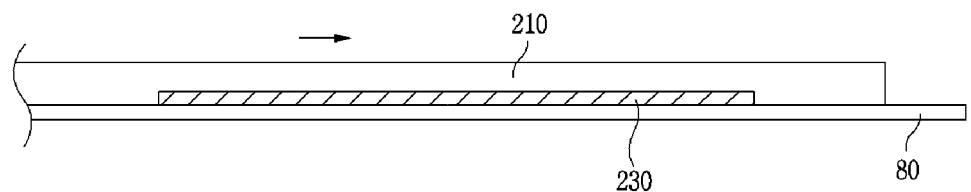
FIGS. 4A to 4C illustrate one example of a process of manufacturing the composite thermoelectric element of FIGS. 3A and 3B.
Figure 4B:
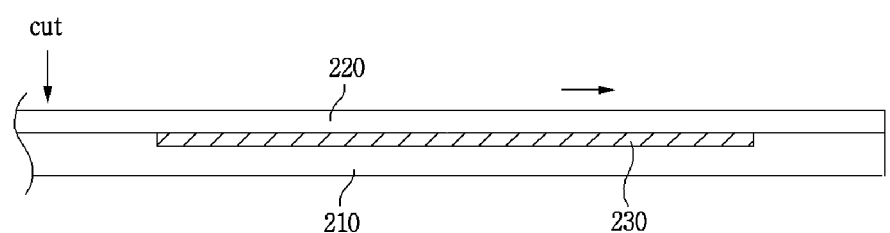
Figure 4C:
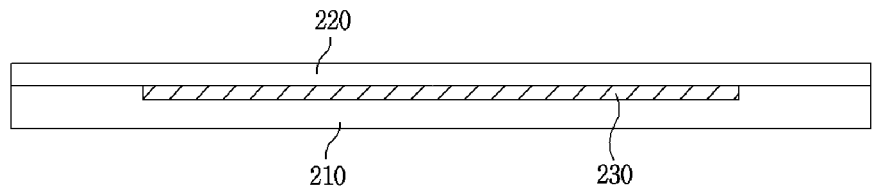

FIGS. 4A to 4C illustrate one example of a process of manufacturing the composite thermoelectric element of FIGS. 3A and 3B.

Referring to FIG. 4A, in a state in which graphite sheets having a uniform size are individually arranged on release paper 80 to be spaced apart, the thermoelectric sheet 210 is manufactured by casting and curing, for example, liquid heat-conductive silicone rubber on the release paper 80 to have a uniform thickness.

Here, the thickness of the thermoelectric sheet 210 may be uniform or approximately similar at a part with the graphite sheet 230 and a part without the graphite sheet 230.

Sequentially, when the release paper 80 is removed, a facing surface of the thermoelectric sheet 210 and one surface of the graphite sheet 230 are exposed. As shown in FIG. 4B, the thermoelectric sheet 220 is manufactured by casting and then curing liquid heat-conductive silicone rubber with a uniform thickness on the exposed surfaces.

As described above, since the solid thermoelectric sheets 210 and 220 are manufactured by curing the liquid silicone rubber by using heat or ultraviolet (UV) rays, the thicknesses thereof are uniform overall due to gravity.

Next, the individual composite thermoelectric element 200 as shown in FIG. 4C is manufactured by cutting a space between the graphite sheets 230.

Since the liquid silicone rubber is cast and cured as described above, all parts around edges of the graphite sheet 230 are filled with the liquid silicone rubber, such that an empty space is not formed around a boundary between the graphite sheet 230 and the thermoelectric sheet 210.

Also, since the graphite sheet 230 may be prevented from being exposed outward at least at a cross section thereof by arranging the graphite sheets 230 at certain intervals and cutting the space between the graphite sheets 230, it is possible to prevent graphite powder from being generated.

FIGS. 5A to 5F illustrate a variety of composite thermoelectric elements.

These composite thermoelectric elements are applied to the embodiments of FIGS. 1A, 1B, 3A and 3B. In the embodiment of FIGS. 3A and 3B, it should be understood that the thermoelectric sheet which covers the graphite sheet is omitted for convenience.

Figure 5A:
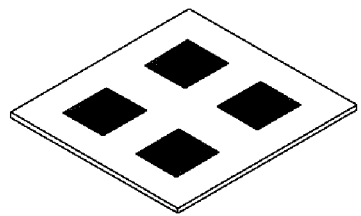
FIGS. 5A to 5F illustrate a variety of thermoelectric elements.

In FIG. 5A, when a plurality of graphite sheets are separated and stuck to a thermoelectric sheet an area of the graphite sheet is large, a structure shown in FIG. 5A may be applied to prevent a splaying phenomenon between the graphite sheet and the thermoelectric sheet. Here, the thermoelectric sheets may be stuck to each other at spaces among the plurality of graphite sheets and may remove the splaying phenomenon to perform reliable heat transfer. Also, since the plurality of graphite sheets are formed to be separated, heat of each of a plurality of heating elements may be removed.

Figure 5B:
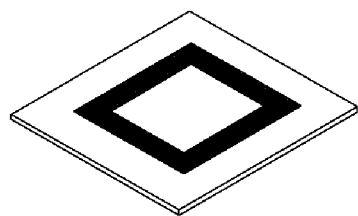
Figure 5C:
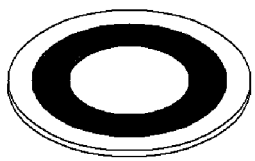
Figure 5D:
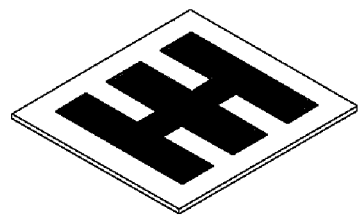
Figure 5E:
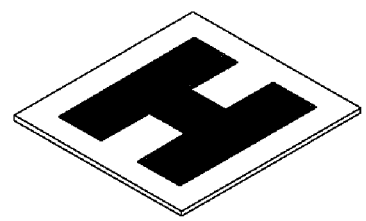
Figure 5F:
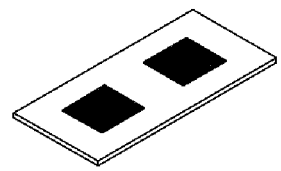

In FIG. 5B, a graphite sheet is not present in a central part such that heat is transferred outward. In FIG. 5C, when a heating element has a circular shape, heat is transferred outward.

Figure 6:
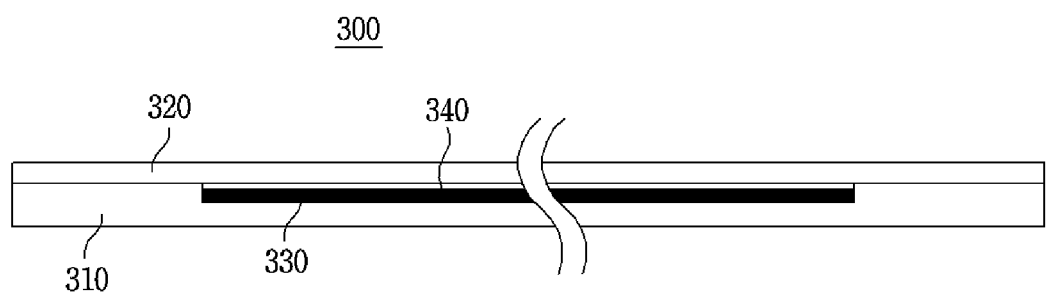
FIG. 6 is a cross-sectional view of a thermoelectric element according to another embodiment of the present invention.

FIG. 6 is a cross-sectional view of a composite thermoelectric element according to another embodiment of the present invention.

A graphite sheet 330 is embedded from a top surface of a thermoelectric sheet 310 and a sticky sheet 340 is stuck to an exposed surface of the graphite sheet 330. In this state, a thermoelectric sheet 320 is stuck to and faces the thermoelectric sheet 310.

The sticky sheet 340 is disposed on release paper while being stuck to bottom surfaces of consecutive graphite sheets provided in a roll state, and a state in which each of the graphite sheets 330 and the sticky sheet 340 are stuck to each other is formed by a converting operation.

In this state, a composite thermoelectric element 300 having a structure shown in FIG. 6 is formed by forming the thermoelectric sheets 310 and 320 by casting and curing liquid silicone rubber as described above.

Due to the structure, since the graphite sheet 330 which is completely converted is not moved by the sticky sheet 340, an initial arrangement state may be maintained.

The sticky sheet 340 may have heat conductivity which may be lower than those of the thermoelectric sheets 310 and 320.

Also, the sticky sheet 340 may have self stickiness higher than those of the thermoelectric sheets 310 and 320 and may have a thickness smaller than those of the thermoelectric sheets 310 and 320 as shown in FIG. 6.

Figure 7A:
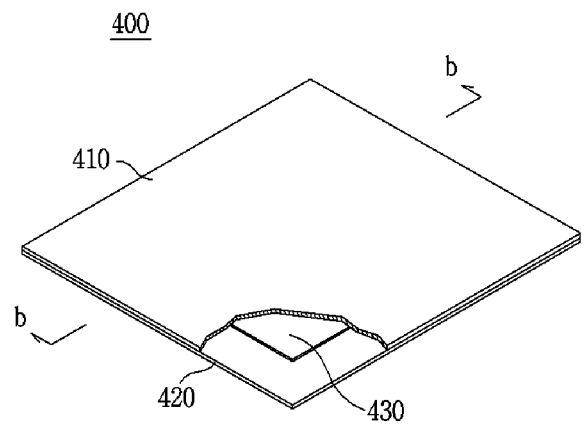
FIG. 7A is a perspective view of a composite thermoelectric element according to another embodiment of the present invention.
Figure 7B:
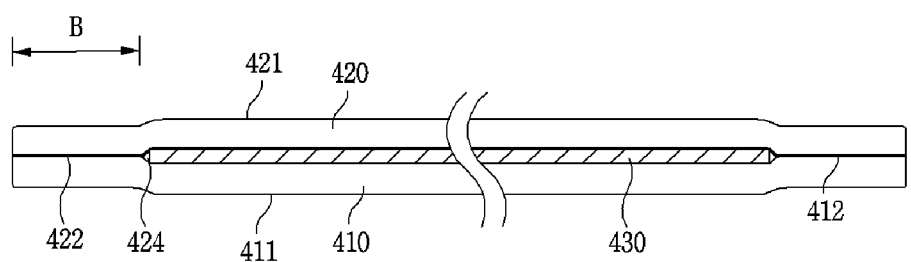
FIG. 7B is a cross-sectional view illustrating the composite thermoelectric element taken along line b-b in FIG. 7A.

FIG. 7A is a perspective view of a composite thermoelectric element according to another embodiment of the present invention, and FIG. 7B is a cross-sectional view illustrating the composite thermoelectric element taken along line b-b in FIG. 7A.

According to the embodiment, solid thermoelectric sheets 410 and 420 are stuck to top and bottom surfaces of the graphite sheets 430 respectively and have large sizes such that edges of the graphite sheet 430 are not exposed outward.

The thermoelectric sheets 410 and 420 are stuck to each other at a facing part B due to self stickiness of any one thereof and include the graphite sheet 430 therein.

The thermoelectric sheets 410 and 420 are self-stuck to each other at the facing part B of the thermoelectric sheets 410 and 420 and are not easily separated from each other by an external force. As a result, the edges of the graphite sheet 430 are prevented from being exposed outward and being delaminated.

At least one of the thermoelectric sheets 410 and 420 may be in a gel phase with low hardness. In the case of gel phase, a thickness of the graphite sheet 430 may be easily accommodated and reliable contact with large facing objects may be provided.

In this embodiment, each of facing surfaces 412 and 422 and exposed surfaces 411 and 421 of the thermoelectric sheets 410 and 420 may include self stickiness. As described above, at least one of the facing surfaces 412 and 422 of the thermoelectric sheets includes self stickiness for mutual adhesion between the thermoelectric sheets 410 and 420.

Here, the self stickiness may be about 50 gf to 1,500 gf but is not limited thereto.

At least one of the exposed surfaces 411 and 421 of the thermoelectric sheets is stuck to an object, for example, a substrate on which a heating element is mounted or a heat dissipation unit such as a case. Self stickiness of the exposed surfaces 411 and 421 may be different from each other.

Since one of the exposed surfaces 411 and 421 of the thermoelectric sheets has self stickiness and the other thereof has no self stickiness, it is possible to allow the composite thermoelectric element to remain in a state of being attached to any one of a heating element and a cooling unit when an electronic product to which the composite thermoelectric element is applied is disassembled.

Here, since a surface of the graphite sheet 430 is lubricative, the graphite sheet 430 and the thermoelectric sheets 410 and 420 are stuck to each other due to a combination of self stickiness and adhesion.

In this embodiment, the facing part B is shown as being formed with a regular width between the edges of the graphite sheet 430 and the edges of the thermoelectric sheets 410 and 420 but may have an irregular width.

When the width of the facing part B is regular, there is provided an advantage in which the thermoelectric sheets 410 and 420 may reliably protect the edges of the graphite sheet 430 and reliably come into contact with facing objects.

Since the graphite sheet 430 is covered by the solid thermoelectric sheets 410 and 420, an empty space 424 is necessarily formed by a step in height of the edges of the graphite sheet 430. Here, when the thermoelectric sheets 410 and 420 are stacked and laminated, since at least one of the thermoelectric sheets 410 and 420 is in a soft gel state and has flexibility to droop due to adhesion and minimize a volume of the empty space 424, a decrease in heat conductivity caused by the empty space 424 may be reduced.

In this embodiment, it is possible to allow a composite thermoelectric element 400 to be easily stuck to an object by allowing the exposed surfaces 411 and 421 of the thermoelectric sheets 410 and 420 to also have self stickiness. In comparison to a conventional PET protection film with an additional adhesive to stick to an object, it is possible to further decrease a thickness thereof and to reduce manufacturing costs thereof.

Also, heat transferred from a heating element may be quickly and easily transferred in a surface direction by decreasing a thickness of one of the thermoelectric sheets 410 and 420, which is attached to the heating element, to be smaller than a thickness of the other thereof.

Figure 8A:
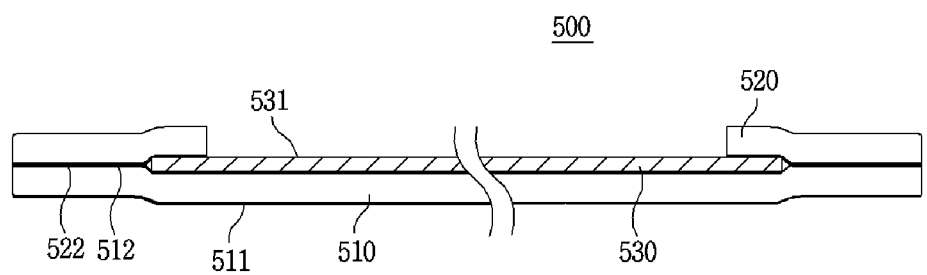
FIGS. 8A and 8B illustrate composite thermoelectric elements according to other embodiments of the present invention.
Figure 8B:
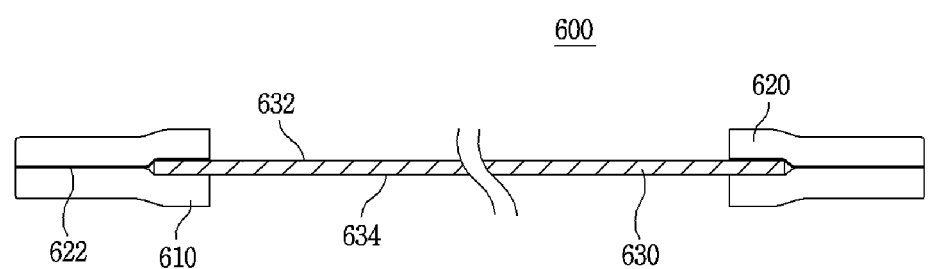

FIGS. 8A and 8B illustrate composite thermoelectric elements according to other embodiments of the present invention.

Hereinafter, for convenience of description, only other parts different from the embodiment shown in FIGS. 7A and 7B will be described.

Referring to FIG. 8A, in a composite thermoelectric element 500, a top surface 531 of the graphite sheet 530 is partially exposed outward, and a thermoelectric sheet 520 covers edges of the top surface 531 with a regular width.

Accordingly, the thermoelectric sheet 520 covers edges of the graphite sheet 530 in a quadrangular ring shape and is stuck to a thermoelectric sheet 510 along edges thereof.

According to the configuration, since an exposed portion of the top surface 531 of the graphite sheet 530 comes into direct contact with a heating element, heat may be more quickly transferred through the graphite sheet 530.

Although adhesion or contact between the thermoelectric sheet 520 and the edges of the graphite sheet 530 is weak, when the above limitations are solved with clamping devices, there is provided an advantage in which the graphite sheet 530 is in direct contact with the heating element.

Referring to FIG. 8B, in a composite thermoelectric element 600, a top surface 632 and a bottom surface 634 of the graphite sheet 630 are partially exposed outward and are covered with thermoelectric sheets 610 and 620 along edges thereof with a regular width.

Accordingly, the thermoelectric sheets 610 and 620 cover edges of the graphite sheet 630 in a quadrangular ring shape and are stuck to each other along edges thereof.

According to the configuration, since exposed portions of the top surface 632 and the bottom surface 634 of the graphite sheet 630 come into direct contact with a heating element or a cooling unit, heat may be more quickly transferred through the graphite sheet 630.

According to the above-described embodiments of the present invention, there are provided advantages as follows. To prevent a cross section of a graphite sheet having high heat conductivity in a surface direction from being exposed outward, a composite thermoelectric element is formed while thermoelectric sheets having high heat conductivity in a thickness direction and elasticity or flexibility and stretch are stuck to each other by using self stickiness of at least one of the thermoelectric sheets such that heat of facing objects may be easily transferred in both the surface direction and the thickness direction, graphite powder may be prevented from being scattered at the cross section, heat may be reliably transferred to a deformation applied from the outside, and an external shock may be absorbed.

According to the above structure, it is possible to prevent graphite powder from being scattered at least at a cross section of a graphite sheet.

Also, since thermoelectric sheets are not stuck by interposing an additional adhesive therebetween, an overall thickness thereof may be reduced and high heat conductivity may be provided.

Also, since various parts including parts at which the thermoelectric sheets are extended from edges of the graphite sheet are self-stuck, adhesion between the thermoelectric sheets and the graphite sheet is reliably maintained such that heat may be reliably transferred.

Also, since the thermoelectric sheets have excellent heat conductivity, elasticity or flexibility and stretch to be self-stuck to each other due to self stickiness, high heat conductivity may be provided and manufacturing costs thereof may be reduced in comparison to a case of using a conventional polyethylene terephthalate (PET) film having low heat conductivity and an additional adhesive.

Also, since at least one surface of the thermoelectric sheets is allowed to have stickiness, a thermoelectric element may be easily stuck to objects and a thickness thereof may be further decreased and manufacturing costs thereof may be reduced in comparison to a conventional PET film in which an additional adhesive is used to be stuck to objects.

Also, since the thermoelectric sheets have low hardness and are easily pushed, when the graphite sheet having a small thickness is stacked and stuck between the thermoelectric sheets and then pushed overall, there is no difference in an overall thickness.

Also, since the thermoelectric sheets have restoration forces and excellent elasticity or flexibility and stretch, adequate contact with facing objects is provided such that reliable contact with the objects may be consistently maintained even when a gap or a space is present between the objects. As a result, heat may be well conducted. Even when the composite thermoelectric element is bent by an external force, bending of the graphite sheet may be minimized and the composite thermoelectric element may be restored to an original shape such that the reliable contact with the objects may be consistently maintained to prevent heat conductivity from being decreased.

Also, since the thermoelectric sheets remain in a gel state having low hardness to have excellent flexibility, an empty space is hardly formed or less formed at edges of the graphite sheet, at which the thermoelectric sheets are stuck to each other, such that high heat conductivity may be provided.

Although the embodiments of the present invention have been described above, it is apparent that a variety of changes may be made by those skilled in the art. Accordingly, the scope of the present invention should not be interpreted while being limited to the above embodiments and should be determined by the following claims.

What is claimed is:

1. A composite thermoelectric element which is interposed between facing objects disposed to face each other and transfers heat between the objects, the composite thermoelectric element comprising:
   a thermoelectric sheet a facing surface and an exposed surface, which are opposite to each other, and having self stickiness at least at the facing surface; and
   a graphite sheet which is embedded in the thermoelectric sheet from the facing surface of the thermoelectric sheet and has a top surface exposed outward, wherein edges of the graphite sheet are separated inward from edges of the thermoelectric sheets such that a contact portion is formed at the facing surfaces of the thermoelectric sheets between the edges, and wherein the contact portion of the thermoelectric sheet is stuck to any one of the objects due to the self stickiness, the graphite sheet comes into contact with the one of the objects, and the exposed surface of the thermoelectric sheet comes into contact with the other of the objects.

2. The composite thermoelectric element of claim 1, wherein a sticky sheet is stuck to the graphite sheet.

3. The composite thermoelectric element of claim 2, wherein the sticky sheet has heat conductivity which is lower than those of the thermoelectric sheets.

4. The composite thermoelectric element of claim 2, wherein stickiness of the sticky sheet is greater than stickiness of the thermoelectric sheets, and a thickness of the sticky sheet is smaller than thicknesses of the thermoelectric sheets.

5. The composite thermoelectric element of claim 1, wherein the thermoelectric sheets are formed by mixing a polymer resin or rubber having elasticity or flexibility and stretch with insulating ceramic powder, metal powder, or a mixture of these types of powder.

6. The composite thermoelectric element of claim 1, wherein a thickness of the composite thermoelectric element is about 1 mm or less, and thicknesses of the thermoelectric sheets are greater than a thickness of the graphite sheet.

7. The composite thermoelectric element of claim 1, wherein an area of the graphite sheet is larger than an area of a heating element in contact with the graphite sheet.

8. The composite thermoelectric element of claim 1, wherein a plurality of such graphite sheets are formed to be separated from one another, or central parts thereof are partially removed.

9. A composite thermoelectric element disposed between objects disposed to face each other to transfer heat between the objects, the composite thermoelectric element comprising:

a graphite sheet; and a pair of thermoelectric sheets which comprise facing surfaces and exposed surfaces, in which the facing surfaces cover a top surface and a bottom surface of the graphite sheet and are adhered thereto to seal the graphite sheet, wherein edges of the graphite sheet are separated inward from edges of the thermoelectric sheets, and a contact portion is formed on the facing surfaces of the thermoelectric sheets between the edges thereof, and wherein the thermoelectric sheets are stuck to each other at the contact portion due to self stickiness of any one of the facing surfaces of the thermoelectric sheets.

10. The composite thermoelectric element of claim 9, wherein a part of any one of the thermoelectric sheets, which corresponds to a part of the graphite sheet, is removed, and wherein the part of the graphite sheet of the removed part comes into direct contact with any one of the objects.

11. The composite thermoelectric element of claim 10, wherein a part of the other of the thermoelectric sheets, which corresponds to the part of the graphite sheet, is removed.

12. The composite thermoelectric element of claim 9, wherein the graphite sheet is embedded in any one of the thermoelectric sheets from the facing surface of the corresponding thermoelectric sheet.

13. The composite thermoelectric element of claim 9, wherein a sticky sheet is stuck to the graphite sheet.

14. The composite thermoelectric element of claim 9, wherein the self stickiness is given by a process of curing a liquid rubber or resin.

15. The composite thermoelectric element of claim 9, wherein the exposed surface of at least one of the thermoelectric sheets comprises self stickiness and is stuck to the object due to the self stickiness of the exposed surface of at least one of the thermoelectric sheets.

16. The composite thermoelectric element of claim 9, wherein the exposed surfaces of the thermoelectric sheets have self stickiness different from each other.

17. The composite thermoelectric element of claim 9, wherein at least one of the thermoelectric sheets is in a gel state.

* * * * *